United States Patent
Kuramitsu et al.

(10) Patent No.: US 6,780,267 B1
(45) Date of Patent: Aug. 24, 2004

(54) ELECTRONIC DEVICE OF CERAMIC

(75) Inventors: Hideki Kuramitsu, Osaka (JP); Atsuo Nagai, Osaka (JP); Yoshiya Sakaguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 166 days.

(21) Appl. No.: 09/830,493

(22) PCT Filed: Sep. 21, 2000

(86) PCT No.: PCT/JP00/06460
§ 371 (c)(1),
(2), (4) Date: Sep. 4, 2001

(87) PCT Pub. No.: WO01/22449
PCT Pub. Date: Mar. 29, 2001

(30) Foreign Application Priority Data

Sep. 22, 1999 (JP) .......................... 11-268636
Oct. 7, 1999 (JP) .......................... 11-286522

(51) Int. Cl.$^7$ .......................... B32B 31/26; H01G 4/12
(52) U.S. Cl. .......................... 156/89.12; 156/89.16; 156/233; 156/235
(58) Field of Search .......................... 156/89.12, 89.16, 156/230, 233, 235, 312; 264/614, 615, 618, 619, 650

(56) References Cited

U.S. PATENT DOCUMENTS

| | | | | |
|---|---|---|---|---|
| T0,909,004 | I4 | * 4/1973 | Neuffer | .................. 264/650 |
| 4,194,040 | A | * 3/1980 | Breton et al. | .................. 428/325 |
| 4,497,677 | A | * 2/1985 | Sanada et al. | .................. 156/89.12 |
| 4,642,148 | A | * 2/1987 | Kurihara et al. | .................. 156/89.18 |
| 4,867,935 | A | * 9/1989 | Morrison, Jr. | .................. 156/89.12 |
| 4,871,608 | A | * 10/1989 | Kondo et al. | .................. 428/209 |
| 5,009,744 | A | * 4/1991 | Mandai et al. | .................. 156/233 X |
| 5,019,200 | A | * 5/1991 | Kawabata et al. | .................. 156/245 |
| 5,540,884 | A | * 7/1996 | Chiao | .................. 419/47 |
| 6,602,370 | B1 | * 8/2003 | Kuramitsu et al. | .................. 156/89.12 |

FOREIGN PATENT DOCUMENTS

| | | |
|---|---|---|
| JP | 47-25649 | 10/1972 |
| JP | 2-42797 | * 2/1990 |
| JP | 4-138244 | 5/1992 |
| JP | 5-175064 | * 7/1993 |
| JP | 5-182861 | 7/1993 |
| JP | 9-237955 | * 9/1997 |
| JP | 9-321411 | * 12/1997 |
| JP | 10-200260 | * 7/1998 |
| JP | 11-74146 | 3/1999 |
| JP | 11-111560 | * 4/1999 |
| JP | 11-233388 | * 8/1999 |

* cited by examiner

Primary Examiner—Melvin C. Mayes
(74) Attorney, Agent, or Firm—McDermott, Will & Emery

(57) ABSTRACT

A method of manufacturing ceramic includes a first step of compressing a ceramic sheet (10a) containing ceramic powder and organic to reduce porosity, a second step of forming a conductor layer (2) of metallic paste on the ceramic sheet (10b), a third step of stacking a plurality of ceramic sheets (10b) into a laminate such that each ceramic sheet (10b) is sandwiched between conductor layers (2), and a fourth step of sintering the laminate. Since the conductor layer (2) is formed on the ceramic sheet (10b) with its porosity reduced, metallic components are hindered from passing into the ceramic sheet (10b). The conductor layer can be formed by transferring onto a ceramic sheet to suppress the diffusion of the metallic components of the conductor layer. This method reduces short circuits of ceramic devices and increases the yield rate.

23 Claims, 4 Drawing Sheets

ELECTRONIC DEVICE OF CERAMIC

TECHNICAL FIELD

The present invention relates to a method of manufacturing ceramic electronic components such as multilayer ceramic capacitors and the like.

BACKGROUND ART

FIG. 7 is a partially cut-away perspective view of a typical multilayer ceramic capacitor comprising a ceramic dielectric layer 1, a conductive layer 2 and a pair of external electrodes 3, in which an end of each respective conductive layer 2 is alternately connected with one of the pair of external electrodes 3 at the two side of the ceramic dielectric layer 1.

Next, a description is given to a method of manufacturing multilayer ceramic capacitors in a prior art.

First, a ceramic sheet eventually constituting the ceramic dielectric layer 1 is prepared by mixing an organic material to a powder mainly composed of barium titanate ,and a metallic paste is applied thereon in a required pattern by a printing method to form the conductive layer 2. Then, a plurality of the ceramic sheets, each applied with the conductive layer 2 thereon, are superimposed one over another in such a way that any two adjoining conductive layers 2 are located opposite to each other with the ceramic sheet sandwiched therebetween, thus obtaining a laminate. The laminate is fired thereafter and a pair of the external electrodes 3 are formed on both side where the conductive layer 2 is exposed.

However, when the porosity of a ceramic sheet is large, the foregoing prior art method allows part of the metallic constituent in the metallic paste to penetrate into the ceramic sheet during the printing process to print directly the metallic paste on the ceramic sheet.

In recent years, a ceramic sheet for a multilayer ceramic capacitor is made thinner and thinner in order to gain higher capacitance in said capacitor, thereby causing a problem of short-circuiting between adjoining two electrodes because of the metal constituent that has penetrated into the ceramic sheet.

The object of the present invention is to provide a method of manufacturing ceramic electronic component with less failures due to said short-circuiting.

SUMMARY OF THE INVENTION

In order to solve the aforementioned problems, the method of manufacturing ceramic electronic components according to the present invention is characterized in that the porosity of a ceramic sheet is first reduced and then a conductive layer is formed on the surface thereof, thereby allowing a metallic constituent to be prevented from penetrating into the ceramic sheet with resulting prevention of short-circuiting failure that may otherwise occur between the conductive layers.

A method of manufacturing ceramic electronic components in a first exemplary embodiment of the present invention comprises:

a first step of applying a pressing force to a ceramic sheet containing a ceramic powder and an organic material to have the porosity thereof reduced;

a second step of forming a conductive layer on the ceramic sheet by the use of a metallic paste;

a third step of producing a laminate by stacking a plurality of ceramic sheets, each having the conductive layer formed thereon, in such a way as having the ceramic sheet sandwiched between the adjoining conductive layers located opposite to each other; and a fourth step of firing the laminate, thus allowing a ceramic electronic component free of short-circuiting failures to be realized.

A method of manufacturing said components in a second exemplary embodiment of the present invention is the method of said components according to the first exemplary embodiment, in which the porosity of the ceramic sheet before a reduction in porosity after the first step is 50% or more, thereby allowing a ceramic electronic component free of short-circuiting failures to be realized.

A method of manufacturing said components in a third exemplary embodiment of the present invention is the method of said components according to the first exemplary embodiment, in which the ceramic sheet contains at least a ceramic constituent and polyethylene at the first step, thereby achieving a great effect in reducing short-circuiting failures, because of a high level of porosity in the ceramic sheet containing polyethylene,compared with other organic materials.

A method of manufacturing ceramic electronic components in a fourth exemplary embodiment of the present invention is the method of said components according to the first exemplary embodiment, in which the porosity of a ceramic sheet at the first step is less than 50%, thereby allowing a metallic constituent to be prevented from penetrating into the ceramic sheet.

A method of manufacturing ceramic electronic components in a fifth exemplary embodiment of the present invention is the method of said components according to the first exemplary embodiment, in which the pressing force applied to the ceramic sheet at the first step is made less than the pressing force as applied in forming the laminate at the third step, thereby allowing a sufficiently uniform pressing force to be applied to the entire laminate in both areas, with and without a conductive layer at the third step, resulting in a realization of an electronic component that has little structural defect due to failures in adhesion between the ceramic sheets.

A method of manufacturing ceramic electronic components in a sixth exemplary embodiment of the present invention is the method of said components according to the first exemplary embodiment, in which the ceramic sheet is heated while a pressing force being applied thereto at the first step, thereby allowing the fluidity of an organic material to be enhanced by the application of heat with a resulting quick reduction in porosity of the ceramic sheet.

A method of manufacturing ceramic electronic components in a seventh exemplary embodiment of the present invention is the method of said components according to the sixth exemplary embodiment, in which the ceramic sheet is heated at the temperature between the glass transition point and the melting point of at least one organic material contained in the ceramic sheet, thereby allowing the fluidity of organic materials to be enhanced by the application of heat with a resulting quick reduction in porosity of the ceramic sheet.

A method of manufacturing ceramic electronic components in an eighth exemplary embodiment of the present invention comprises:

a first step of applying a pressing force to reduce the porosity in a ceramic sheet comprising a ceramic powder and an organic material;

a second step of forming a conductive layer by a metallic paste on a base film in advance and superimposing the conductive layer on the ceramic sheet;

a third step of producing a laminate by stacking a plurality of the ceramic sheets, each having the conductive layer superimposed thereon, in such a way as having the ceramic sheet sandwiched between the adjoining conductive layers located opposite to each other; and a fourth step of firing the laminate, thereby allowing a ceramic electronic component free of short-circuiting failures to be realized.

A method of manufacturing ceramic electronic components in a ninth exemplary embodiment of the present invention is the method of said components according to the eighth exemplary embodiment, in which the porosity of the ceramic sheet before the first step is 50% or more, thereby allowing a said component free of short-circuiting failures to be realized.

A method of manufacturing ceramic electronic components in a tenth exemplary embodiment of the present invention is the method of said components according to the eighth exemplary embodiment, in which the ceramic sheet is prepared so as to contain at least a ceramic powder and polyethylene at the first step, thereby achieving a great effect in reducing short-circuiting failures. The rate of volumetric shrinkage of the ceramic sheet after the application of a pressing force thereto is made uniform in those composition because of the high level in porosity of the ceramic sheet before applying the pressing force thereto and allowing a further reduction in porosity of the ceramic ceramic sheet to be achieved.

A method of manufacturing ceramic electronic components in an eleventh exemplary embodiment of the present invention is the method of said components according to the eighth exemplary embodiment, in which the porosity of the ceramic sheet after the first step is less than 50%, thereby allowing the metallic constituent to be prevented from penetrating into the ceramic sheet.

A method of manufacturing ceramic electronic components in a twelfth exemplary embodiment of the present invention is the method of said components according to the eighth exemplary embodiment, in which the pressing force applied to the ceramic sheet at the first step is made less than the pressing force as applied in forming the laminate at the third step, thereby allowing a sufficiently uniform pressing force to be applied to the entire laminate in both region with and without the conductive layer at the third step, resulting in a realization of an electronic component that has little structural defect due to failures in adhesion between the ceramic sheets.

A method of manufacturing ceramic electronic components in a thirteenth exemplary embodiment of the present invention is the method of said components according to the eighth exemplary embodiment, in which the ceramic sheet is heated while a pressing force being applied thereto at the first step, thereby allowing the fluidity of the organic material to be enhanced by the heat application with a resulting quick reduction in porosity of the ceramic sheet.

A method of manufacturing ceramic electronic components in a fourteenth exemplary embodiment of the present invention is the method of said components according to the eighth exemplary embodiment, in which the ceramic sheet is heated at the temperature between the glass transition point and the melting point of at least one organic material contained in the ceramic sheet, thereby allowing the fluidity of organic materials to be enhance by the heat application with a resulting quick reduction in porosity of the ceramic sheet.

A method of manufacturing ceramic electronic components in a fifteenth exemplary embodiment of the present invention is the method of said components according to the eighth exemplary embodiment, in which the amount of an organic constituent in the conductive layer before lamination process is from 5 wt % to 15 wt % against 100 wt % of the metallic constituent at the third step, thereby allowing the sufficient adhesion between the conductor and the ceramic sheet to be realized, resulting in obtaining a ceramic component that has little structural defect.

A method of manufacturing ceramic electronic components in a sixteenth exemplary embodiment of the present invention is the method of said components according to the eighth exemplary embodiment, with additional step of applying a pressing force to the conductive layer in the thickness direction thereof placed between the second step and the third step, thereby allowing the microscopic asperities on the surface of the conductor layer to be reduced and contributing further to the prevention of short-circuiting failures.

A method of manufacturing ceramic electronic components in a seventeenth exemplary embodiment of the present invention comprises:

a first step of preparing a laminate by stacking ceramic sheets, each composing an organic material and a ceramic powder and conductive layers one over another alternately; and a second step of firing the laminate, in which the ceramic sheet is formed with the organic material arranged horizontally in a mesh-like structure and with the organic material and ceramic powder arranged vertically at random, thereby allowing a metallic constituent to be prevented from penetrating the ceramic sheet with a resulting contribution to realizing a ceramic electronic component which is less susceptible to short-circuiting failures.

A method of manufacturing ceramic electronic components in an eighteenth exemplary embodiment is the method according to the seventeenth exemplary embodiment, in which the porosity of the ceramic sheet is less than 50%, thereby allowing a metallic constituent to be prevented from penetrating the ceramic sheet.

A method of manufacturing ceramic electronic components in a nineteenth exemplary embodiment is the method according to the seventeenth exemplary embodiment, in which, after the conductive layer formed on a base film is superimposed on the ceramic sheet at the first step, a step of peeling off the base film and a step of superimposing the ceramic sheet on the conductive layer are repeated one after another, thereby allowing the solvent constituent in the conductive layer to be reduced when compared with the case where the conductive layer is formed directly on the ceramic sheet with a resulting contribution to preventing the metallic constituent from penetrating into the ceramic sheet.

A method of manufacturing ceramic electronic components in a twentieth exemplary embodiment of the present invention is the method according to the nineteenth exemplary embodiment, with an additional step of applying a pressing force to the conductive layer on the base film in the thickness direction before the conductive layer is superimposed on the ceramic sheet, thereby allowing the microscopic asperities on the surface of the conductor layer to be reduced, with a resulting contribution to preventing the metallic constituent from penetrating into the ceramic sheet.

A method of manufacturing ceramic electronic components in a twenty first exemplary embodiment of the present invention is the method of said components according to the seventeenth exemplary embodiment, in which the conductive layer is deposited by the thin film process at the first step, in this case a metallic film is grown into a plate-like shape on the ceramic sheet, thereby allowing the metallic constituent to be prevented from penetrating into the sheet.

A methods of manufacturing ceramic electronic components in a twenty second exemplary embodiment to a twenty fourth exemplary embodiment of the present invention comprise a step of preparing a laminate by stacking ceramic sheets, each containing an organic material and a ceramic powder, and conductive layers one over another alternately, in which the ceramic sheet is formed with the organic material arranged horizontally in a mesh-like structure and arranged at random in the thickness direction, thereby having the particles of the ceramic powder absorbed in the meshes of the organic material. As a result, the ceramic particles are also arranged at random, each presenting a mesh-like structure. Thus, a ceramic electronic component characterized as having a structure formed by stacking the ceramic layers, each having mesh-like structures of ceramic particles arranged at random, and the conductive layers one over another alternately shows a reduced number of short-circuiting pathes.

PREFERRED MODE FOR CARRYING OUT THE INVENTION

Next, a description is given to exemplary embodiments of the present invention with respect to a multilayer ceramic capacitor as a typical ceramic electronic component with reference to drawings.

First Exemplary Embodiment

Figure 1:
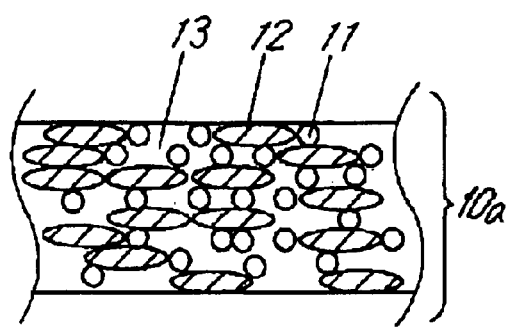
FIG. 1 is a partially enlarged cross-sectional view of a ceramic sheet before a reduction process in porosity.

First, a ceramic sheet 10a of 10 μm thick is prepared by the use of a ceramic powder composing barium titanate as major component and polyethylene of an average molecular weight of 400,000 or more. The porosity of this ceramic sheet 10a usually is around 65%. FIG. 1 is a partially enlarged cross-sectional view of the ceramic sheet 10a, showing that ceramic particles 11 are sporadically located among the fibers of polyethylene 12 with a lot of voids 13 formed therein. In addition, the polyethylene 12 is formed in a mesh-like structure extending horizontally and at random in the thickness direction, where the ceramic particles 11 are absorbed in the meshes, thereby eventually having ceramic particles 11 also arranged in a mesh-like structure extending horizontally and at random vertically.

Figure 3:
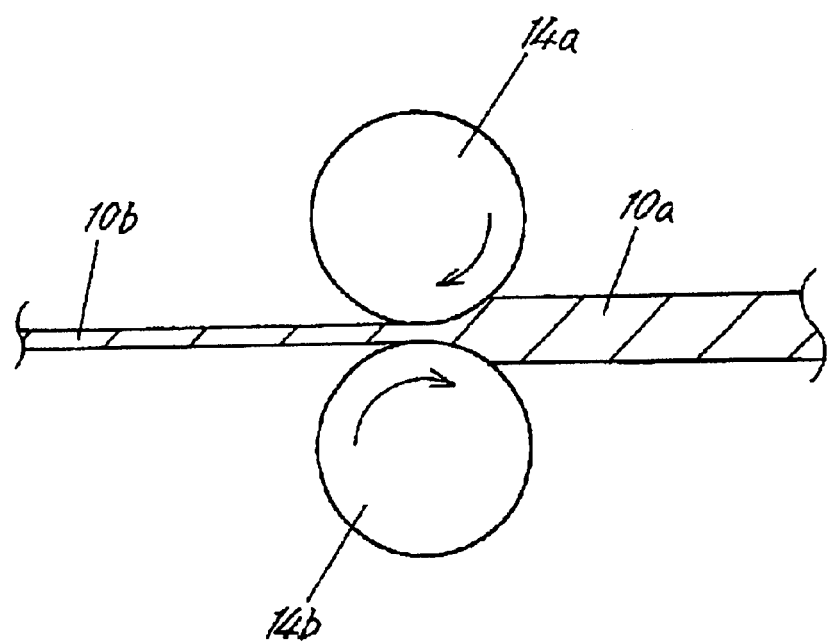
FIG. 3 is a diagram to show the manufacturing process for a ceramic sheet according to the present invention.

Next, as shown in FIG. 3, the ceramic sheet 10a is passed through between rollers 14a and 14b, each provided with a smooth surface At this time, the roller 14a and roller 14b are, respectively, rotating in a direction opposite to each other, and the ceramic sheet 10a is applied with a pressing force in the direction of thickness thereof and also heated. By having the ceramic sheet 10a applied with heat in addition to a pressing force, the porosity thereof is allowed to be reduced easily. More specifically, by an application of heat to said sheet 10a, the fluidity of polyethylene 12 is increased at the process of a pressing force application, resulting in having the air inside of said sheet 10a discharged outside and also become the density of the ceramic particles 11 higher. It is preferred that the heat treatment is carried out at the temperature between a glass transition point of polyethylene and the melting point thereof. More specifically, the optimum heating temperature ranges from 60° C. to 150° C.

Instead of using the rollers 14a and 14b, a press plate is allowed to be used to perform one axis pressing in the thickness direction, to reduce the porosity of the ceramic sheet 10a. The rollers 14a and 14b are used for continuous processing. In the present exemplary embodiment, test ceramic sheets 10b are prepared in four kinds of porosity, i.e., 40%, 30%, 20% and 10%.

Figure 2:
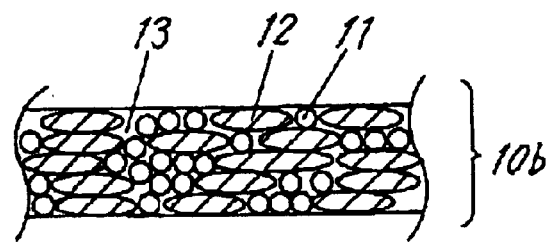
FIG. 2 is a partially enlarged cross-sectional view of a ceramic sheet after a reduction in porosity according to the present invention.

FIG. 2 is a partially enlarged cross-sectional view of the ceramic sheet 10b after the application of a pressing force and heat treatment. As shown in FIG. 2, the region occupied by voids 13 are reduced dramatically. Moreover, the fibers of polyethylene 12 are formed in a mesh-like structure extending horizontally and at random in the thickness direction with the ceramic particles 11 absorbed in the meshes formed of polyethylene fibers. Then, a metallic paste is prepared by the use of nickel powder as a metallic constituent, a binder formed of ethylcellulose, acrylic resin and butyral resin, benzylbutylphtalate as a plasticizer, and an aliphatic compound or an aromatic compound as a solvent, and the metallic paste is printed on the ceramic sheet 10b, where the porosity has been reduced already, in a desired pattern and then dried, thereby realizing a conductive layer of 2 to 2.5 μm thick.

Next, dummy layers are prepared by stacking one over another a plurality of ceramic sheets 10b, without conductive layer 2 and then a required number of a ceramic sheet 10b with a conductive layer 2 formed thereon are superimposed on the dummy layers, and further dummy layers are stacked thereon, thereby realizing a provisional laminate. At this time, it does not matter whether the ceramic sheet 10a having the porosity not reduced or having the porosity reduced as the dummy sheets. However, when the conductive layer 2 is stacked to 100 layers or more or when the porosity of a ceramic sheet is less than 20%, the use of the dummy sheet 10a having the porosity not reduced is preferable, because the unbalance of the pressing force caused by a difference in level existing between the region with the conductive layer 2 and the region without conductive layer 2 is relieved. With the present exemplary embodiment, the ceramic sheets 10b of 150 layer with the conductive layers 2 formed thereon are used and the dummy sheets 10a without porosity reduction are used.

After a pressing force is applied to the entire provisional laminate, the laminate is cut into a desired shape, degreased and then fired. The degreasing process is preferably to be performed by the steps of eliminating the plasticizer from the laminate while the temperature of the laminate being elevated and then eliminating the binder with the temperature of the laminate further elevated, because a new chemical compound is created from the plasticizer and binder upon quick heating the laminate at a dash in order to eliminate the plasticizer and binder at the same time, and is left in the laminate even after the degreasing process. During the step of firing, said chemical compound is burned and splashed out of the laminate and cause structural defects in the laminate such as delamination and the like, resulting in the increased number of short-circuiting failures. Furthermore, it is required to prevent the nickel contained in the conductive layer 2 from being excessively oxidized, when the steps of degreasing and firing are performed in succession.

Figure 7:
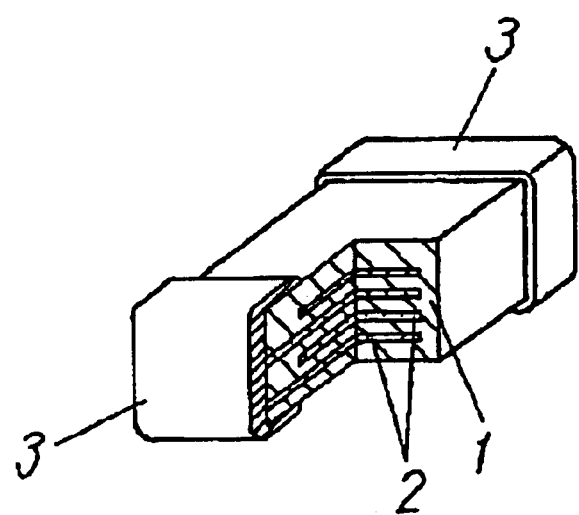
FIG. 7 is a partially cut-away perspective view of a typical multilayer ceramic capacitor.

After the step of firing, the ceramic dielectric layer 1 composing barium titanate as a major component and the conductive layer 2 composing nickel as a major component are combined together by sintering. Thereafter, the external electrodes 3 composing of copper and the like are formed, on both end surfaces of the sintered product where the conductive layer 2 exposed at the end surfaces by baking or plating process, thereby obtaining multilayer ceramic capacitor as shown in FIG. 7.

TABLE 1

| Porosity | Prior Art 1 (50%) | 40% | 30% | 20% | 10% |
|---|---|---|---|---|---|
| Number of Short-circuiting | 83/1000 | 2/1000 | 1/1000 | 0/1000 | 0/1000 |

Fraction defectives of multilayer ceramic capacitors, each having 150 effective layers (the number of ceramic dielectric layers 1 sandwiched between two conductive layers 2), are shown in Table 1 by comparing the multilayer ceramic capacitors prepared according to the present exemplary embodiment of the invention with the capacitor 1 according to a prior art.

The prior art capacitor 1 is prepared according to the conventional method applied the conductive layer 2 on a ceramic sheet 10a with no reduction in porosity. As shown in Table 1, the fraction defectives due to short-circuiting are greatly reduced with the capacitors in the present exemplary embodiment when compared with the capacitor 1 according to the prior art. As the result of analyzing the cross-section of a multilayer ceramic capacitor with short circuiting failure, it is observed that the metallic path goes through the dielectric layers 1. Therefore, the present exemplary embodiment allows the metallic constituent in the conductive layer 2 to be prevented from penetrating into the ceramic sheet 10b, thereby greatly reducing the number of short circuits failures and enabling the remarkable improvement in manufacturing yields of multilayer ceramic capacitors.

Particularly, as in the present exemplary embodiment, the high polymer polyethylene used as the binder is bulky when compared with polyvinyl butyral resin and acrylic resin, making the ceramic sheet 10a rather high in porosity. Therefore, particularly in this case, reduction process of the porosity before forming the conductive layers 2 as proposed in the present invention are extremely effective in reducing failures due to short-circuiting.

Second Exemplary Embodiment

In the first exemplary embodiment, a conductive layer 2 is formed by printing directly a metallic paste on the ceramic sheet 10a that has already been reduced in porosity, but in the present exemplary embodiment a conductive layer 2 formed in advance on a base film 15 made of polyethyleneterephtlate and the like is transferred onto the ceramic sheet 10a.

First, the porosity of the ceramic sheet 10a is reduced in the same way as in the first exemplary embodiment, and four different ceramic sheets 10a having 40%, 30%, 20% and 10%, , in porosity are prepared.

Figure 4:
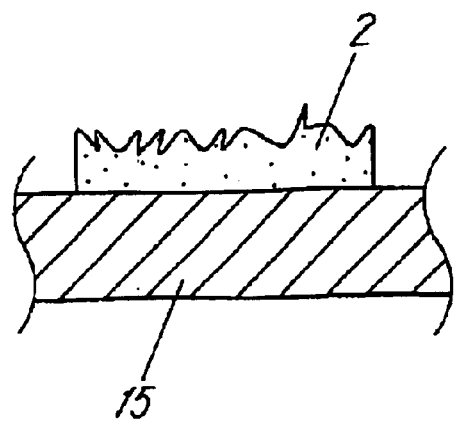
FIG. 4 is a cross-sectional view of a conductive layer prepared on a base film before a surface smoothing treatment is applied thereto according to the present invention.

Further, as shown in FIG. 4, a conductive layer 2 is formed on the base film 15 by printing a metallic paste thereon in a desired pattern and thendrying the paste. Thereafter, almost all the solvent contained in said layer 2 is released, thereby allowing the surface of theconductive layer 2 to be hardened with almost only the metallic constituent, plasticizer and binder remained in said layer 2. More specifically,said layer 2 is prepared so that the organic constituent contained may account for 5 to 15 wt %, more preferably 8 to 12 wt %, against 100 wt % ofthe metallic constituent because, when the organic constituent is less than 5 wt %, the adhesion of said layer 2 to the ceramic sheet 10b is likely to be weak and, when the organic constituent exceeds 15 wt %, the adhesion of said layer 2 tends to become excessive, thereby making it difficult for said layer 2 to be made with a desired pattern.

At this time, in order to release the base film 15 from layer 2 easily at a later step, it is desirable for said layer 2 to be printed a release agent layer (not shown in the drawing) formed of at least one selected from a group of acrylic resin, melamine resin, epoxy resin and silicon resin beforehand on the base film 15. Particularly, the mixture of acrylic resin and melamine resin provides an excellent releasing ability. Silicon resin has both an excellent releasing ability and an excellent resistance to solvents and humidity.

Next, after having an dummy layer formed by stacking one over another a plurality of ceramic sheets 10a without conductive layers on a supporter, a conductive layer together with a base film 15 is superimposed on a ceramic sheet 10b so as to have the conductive layer 2 brought into direct contact with the ceramic sheet 10b and then a pressing force is applied from both sides thereof vertically, thereby allowing said layer 2 and ceramic sheet 10b to be adhered with each other. This process of a pressing force application is preferably performed at the temperatures ranging from room temperature to a temperature, at which the plasticizer in said layer 2 is starting to be released outside. (The temperature is 150° C. in the present exemplary embodiment.) The reason is that, when an excessive amount of the plasticizer is released,said layer 2 tends to become hard and brittle, resulting in a reduction in the adhesion between the ceramic sheet 10b and said layer 2 and creation of structural defects at the process of stacking and firing. Accordingly, at the foregoing temperatures treatment, the binder and plasticizer contained in said layer 2 are made softer, thereby allowing the adhesion between said layer 2 and the ceramic sheet 10b to be enhanced.

When the content level of the plasticizer and that of the binder are low in said layer 2, the temperatures applied during the application of a pressing force are increased, thereby making the plasticizer and binder chemically active with resulting enhancement of the adhesion between said layer 2 and the ceramic sheet 10b. On the other hand, when the content level of the plasticizer and that of the binder are high, thereis no need of additional heating since the adhesion between said layer 2 and the ceramic sheet 10b is strong enough even at room temperature. In other words, it is desirable to adjust the heating temperatures according to the kinds of organic constituents and the content levels thereof.

Then, the base film 15 is peeled off said layer 2 and the ceramic sheet 10b of the next layer is superimposed thereon. Thereafter, another said layer 2 with a base film 15 attached thereon is superimposed on the ceramic sheet 10b and a pressing force is applied thereto under the same condition as above. This stacking process of the ceramic sheet 10b and said layer 2 is repeated a desired number of times, and finally a ceramic sheet 10a is superimposed thereon to form an dummy layer.

Following the completion of the above steps, a multilayer ceramic capacitor with 150 effective layers is prepared according to the same steps as described in the first exemplary embodiment.

TABLE 2

| Porosity | Prior Art 2 (50%) | 40% | 30% | 20% | 10% |
|---|---|---|---|---|---|
| Number of Short-circuiting | 21/1000 | 0/1000 | 0/1000 | 0/1000 | 0/1000 |

Fraction defectives of multilayer ceramic capacitors due to short-circuiting are shown in Table 2 by comparing the multilayer ceramic capacitors prepared according to the present exemplary embodiment of the invention with the capacitor by a prior art.

The multilayer ceramic capacitor by the prior art is prepared according to the foregoing method by the use of a ceramic sheet 10a without reduction process in porosity. As shown in Table 2, the short-circuiting failure are greatly reduced with the capacitors in the present exemplary embodiment when compared with the capacitor by the prior art. In addition, it is also observed that the short-circuiting failure are reduced with the multilayer ceramic capacitors in the present exemplary embodiment when compared with the capacitors in the first exemplary embodiment. This is because, in addition to the reduction in porosity, the metallic constituent is further prevented from penetrating into the ceramic sheet 10b, since the conductive layer 2 is transferred onto the ceramic sheet 10b after being dried.

As a result, according to the present exemplary embodiment, the penetration of the metallic constituent into the ceramic sheet 10b is further prevented in comparison with the first exemplary embodiment, thereby allowing the failures due to short-circuiting between the conductive layers 2 to be reduced remarkably, leading to a great improvement in yields.

When the ceramic sheet 10b and conductive layer 2 are stacked one over another alternately according to the present exemplary embodiment, a pressing force is applied to the ceramic sheet 10b every time one layer thereof is stacked. Alternatively, it is acceptable to simply stack the ceramic sheet 10b without applying any pressing force thereto and to apply a pressing force only after said layer 2 formed on a base film 15 is stacked, thereby establishing the adhesion between the ceramic sheets 10b and the adhesion between the ceramic sheet 10b and said layer 2 at the same time. In the latter process, the number of times of the pressing force application process are reduced in half compared with the former process. This pressing force application process takes about 1 to 30 seconds for one time of operation. The longer time is required in the pressing process with increasing stacked layer, so that the process cost much. Particularly, when said layer 2 is formed of a base metal, the cost involved with stacking process accounts for rather a large portion of the cost of the multilayer ceramic capacitors. The latter process for production of provisional laminates is preferred from a point of process cost.

With the present exemplary embodiment also, a ceramic sheet 10a without reduction in porosity is used as the dummy layer since there are provided more than 100 layers of the conductive layer 2.

Third Exemplary Embodiment

In the present exemplary embodiment, as shown in FIG. 4, a conductive layer 2 formed on a base film 15 is superimposed on a ceramic sheet 10b together with the base film 15 so as to bring said layer 2 into contact with the ceramic sheet 10b, thus preparing the ceramic sheet 10b with said layer 2 attached thereto and producing a laminate by stacking said ceramic sheets 10b.

More specifically, a ceramic sheet 10b with a reduction in porosity, prepared in the same manner as in the first and second exemplary embodiments, and said layer 2 formed on a base film 15 together with the base film are sandwiched between rollers to apply a pressing force thereto, thereby bringing the ceramic sheet 10b and said layer 2 close contact with each other. The conductive layer 2 during the time of the pressing force application is held at room temperature to the temperature, at which the plasticizer contained in said layer 2 is not released excessively, in the same way as in the second exemplary embodiment.

Thus, said layer 2 and ceramic sheet 10b are formed on the base film 15 and, after cutting the foregoing to a desired shape, a desired number of the shapes are stacked one over another in succession and then a provisional laminate can be obtained by applying a pressing force thereto.

When the provisional laminate is produced, it does not matter whether repeating a process of stacking the foregoing on an dummy layer as in the first and second exemplary embodiments so as to have the base film 15 situated on the top and peeling off the base film 15 after applying a pressing force thereto or repeating a process of first eliminating the base film 15 and then stacking a ceramic sheet 10b together with said layer 2, immediately followed with an application of a pressing force thereto. However, when the process of stacking is performed so as to have said layer 2 located upward after the elimination of the base film 15, it is important to take into consideration that said layer 2 does not stick to the press plate. For example, it is favorable to put some film between the conductive layer 2 and the aforementioned press plate and the like. Therefore, it is preferred that the ceramic sheet 16 is arranged to be located upward when the base film 15 is peeled off and then the process of stacking is performed.

Thereafter, a multilayer ceramic capacitor can be obtained in the same way as in the first exemplary embodiment. When a ceramic sheet 10b with said layer 2 attached thereto is prepared by the use of rollers as in above, the process can be performed at a relatively high speed. More specifically, in the third exemplary embodiment, when compared with the second exemplary embodiment, in which every time a ceramic sheet 10b and said layer 2 are stacked one over another a pressing force is applied thereto, the number of pressing force application times is allowed to be reduced in half, leading to a reduction in cost of manufacture.

TABLE 3

| Porosity | Prior Art 2 (50%) | 40% | 30% | 20% | 10% |
|---|---|---|---|---|---|
| Number of Short-circuiting | 31/1000 | 1/1000 | 0/1000 | 0/1000 | 0/1000 |

Fraction defectives of multilayer ceramic capacitors with 150 effective Layers (the number of layers of the cermic dielectric layer 1 sandwiched between the conductive layers 2) due to short-circuiting are shown in Table 3 by comparing the multilayer ceramic capacitors prepared according to the present exemplary embodiment of the invention with the ceramic capacitor 3 by the prior art. As clearly shown in Table 3, the fraction defectives due to short-circuiting are greatly reduced with the capacitors in the present exemplary embodiment when compared with the capacitor 3 the prior art. As the result of analyzing the cross-section of a multilayer ceramic capacitor, it is observed that the short-circuiting failure occurred between the conductive layers 2.

Therefore, the present exemplary embodiment allows the number of short circuits between conductive layers 2 to drop off sharply, thereby enabling the remarkable improvement in manufacturing yield and the reduction in cost of the capacitors.

Fourth Exemplary Embodiment

In the present exemplary embodiment also, a conductive layer 2 is formed on a base film 15 made of a polyethyleneterephtalate film and the like instead of forming the conductive layer 2 directly on a ceramic sheet 10*b*.

First, in the same way as in the previous exemplary embodiments, four kinds of ceramic sheet with a porosity of 40%, 30%, 20% and 10% are prepared.

Further, in the same way as in the first exemplary embodiment, a mettalic paste is applied onto the base film 15 by printing in a desired pattern and then dried to form the conductive layer 2. Thereafter, by having almost all the solvent contained in said layer 2 released to harden the surface thereof, thereby said layer2 are formed of a metallic constituent, plasticizer and binder. More specifically, the organic constituents contained in said layer 2 are made to account for 5 to 15 wt % or more preferably 8 to 12 wt % against 100 wt % of the metallic constituent. The reason for above is that, when the organic constituents are less than 5 wt %, the adhesion with the ceramic sheet 10*b* is impaired and, on the other hand, when the organic constituents exceed 15 wt %, the adhesion of the conductive layer 2 becomes too much to make it impossible for said layer 2 to be shaped to the desired pattern.

At this time, in order to release said layer 2 and base film 15 readily from each other at a later step, it is desirable for said layer 2 to be printed after a release agent layer (not shown in the drawing) containing of at least one selected from a group of acrylic resin, melamine resin, epoxy resin and silicon resin beforehand on the base film 15. Particularly, a release agent containing of the mixture of acrylic resin and melamine resin provides a desirable releasing ability. In addition, when a silicon resin is used as the release agent, not only the desirable releasing ability is realized but also excellent resistance to solvent and humidity is effectively realized. In this case, the surface of saidlayer 2 have microscopic asperities as shown in FIG. 4.

Figure 5:
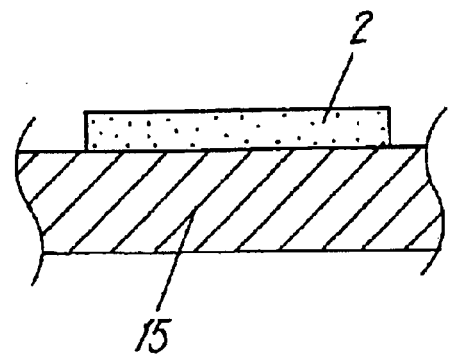
FIG. 5 is a cross-sectional view of a conductive layer after a surface smoothing treatment is applied thereto according to the present invention.
Figure 6:
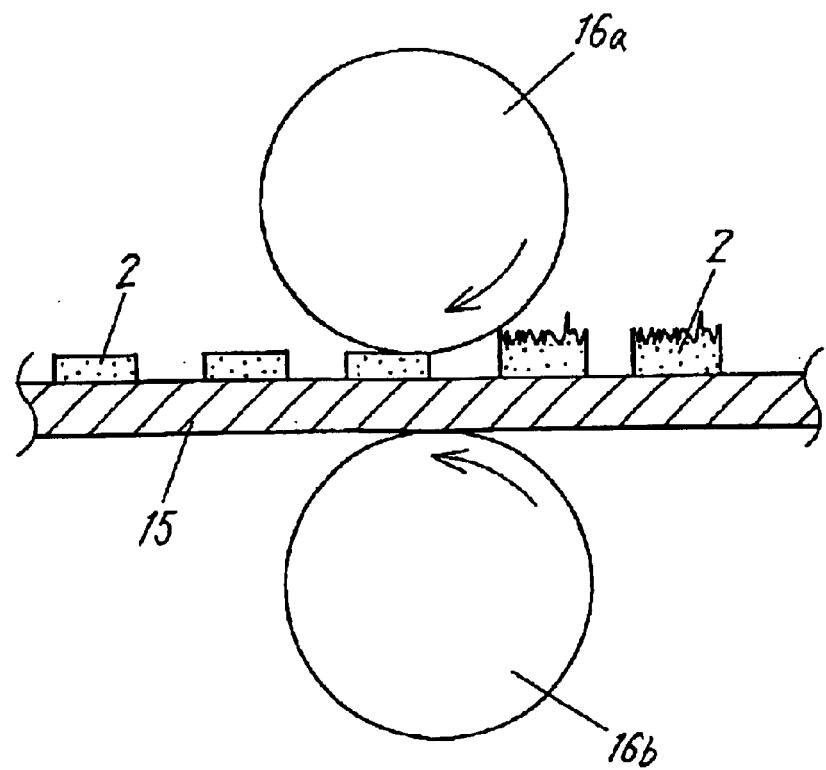
FIG. 6 is a cross-sectional drawing for illustrating the process of smoothing treatment to obtain the conductive layer as shown in FIG. 5.

Then, the conductive layer 2 together with the base film 15 after drying is passed between rollers 16*a* and 16*b*, each having a smooth surface, as shown in FIG. 6 , thereby reducing the asperities on the surface of said layer 2 with a pressing force applied in the thickness direction thereof FIG. 5 is a cross-sectional view of said layer 2 after the surface thereof is made smooth.

Next, after dummy layers are formed on a supporting member by stacking a plurality of ceramic sheets 10*a*, without conductive layer formed thereon, said layer 2 together with a base film 15 is superimposed on the dummy layers so as to bring said layer 2 into direct contact with the ceramic sheet 10*b* and then a pressing force is applied in the thickness direction thereof, thereby allowing said layer 2 and ceramic sheet 10 to be adhered with each other. The pressing force application process is preferably to be performed at temperatures ranging from room temperature to the temperature, at which the plasticizer contained in said layer 2 is not released too much. (The temperature is 150° C. with the present exemplary embodiment.) The reason is that, when too much plasticizer is released, said layer 2 becomes so hard and brittle so as to reduce the adhesion between the ceramic sheet 10*b* and said layer 2, resulting in bringing about structural failures at the process of stacking multilayer and firing. Therefore, as far as the foregoing temperature range is abided by, the binder and plasticizer contained in said layer 2 remain soft, thereby allowing the adhesion between said layer 2 and the ceramic sheet 10*b* to be enhanced.

When the plasticizer and binder content in said layer 2 is low, by raising the temperature, at which a pressing force is applied thereto, the palasticizer and binder are made chemically active, thereby allowing the adhesion between said layer 2 and the ceramic sheet 10*b* to be enhanced. On the other hand, when the plasticizer and binder content is high, the adhesion between said layer 2 and the ceramic sheet 10*b* is enough even at room temperature and, therefore, there is no need of additional heating. In other words, it is preferred that the heating are adjusted according to the kind and content of organic constituents contained in said layer 2.

Next, the base film 15 is peeled off and the ceramic sheet 10*b* is superimposed on said layer 2. Then, said layer 2 together with the base film 15 is again superimposed on the ceramic sheet 10*b* and a pressing force is applied thereto under the foregoing condition. This stacking process of the ceramic sheet 10*b* and said layer 2 is performed repeatedly the required number of times to obtain a provisional laminate. Thereafter, in the same way as in the first exemplary embodiment, a multilayer ceramic capacitor with 150 effective layers is produced.

TABLE 1

| Porosity | Prior Art 4 (50%) | 40% | 30% | 20% | 10% |
| --- | --- | --- | --- | --- | --- |
| Number of Short-Circuiting | 9/1000 | 1/1000 | 0/1000 | 0/1000 | 0/1000 |

In Table 4, fraction defectives of multilayer ceramic capacitors are shown by making a comparison between the multilayer ceramic capacitors prepared according to the present exemplary embodiment and the capacitor 4 by the prior art.

The capacitor 4 by the prior art is prepared according to the method as described in the second exemplary embdiment by the use of a ceramic sheet 10*a* without reduction in porosity. As clearly seen in Table 4, the fraction defectives due to short-circuiting are greatly reduced with the multilayer ceramic capacitors in the present exemplary embodiment when compared with the prior art multilayer ceramic capacitor 4. In addition, it is also observed that the fraction defectives due to short-circuiting are reduced in the present exemplary embodiment even when compared with the multilayer ceramic capacitors in the second exemplary embodiment. This is because, in addition to the reduction in porosity, the metallic constituent is allowed to be further prevented from penetrating into the ceramic sheet 10*b*, the penetrating via the asperities of said layer 2 sticking in the ceramic sheet 10*b*.

As a result, according to the present exemplary embodiment, the penetration of the metallic constituent into the ceramic sheet 10*b* is further prevented in comparison with the second exemplary embodiment, thereby allowing the failures due to short-circuiting between said layers 2 to be reduced remarkably, leading to a great improvement in yields.

Furthermore, it does not matter whether a laminate is produced by having the ceramic sheets 10*b* and said layers 2 stacked one over another alternately as described in the second exemplary embodiment or by preparing first a ceramic sheet 10b with said layer 2 attached thereto as in the third exemplary embodiment and then performing the stacking thereof Whichever method may be employed, the resulting effect is the same as in the second and third exemplary embodiments and the fraction defectives due to short-circuiting are further reduced.

Next, a description is given to key points of the present invention.

(1) The present invention is effectively applicable in particular to a ceramic sheet 10a with the porosity of exceeding 50% before a reduction in porosity.

(2) When polyethylene is contained in ceramic sheets 10a and 10b as in each respective exemplary embodiment of above, upon having the ceramic sheets 10a and 10b left standing for a long period after a reduction is made in porosity with no heat applied thereto, air enters into the ceramic sheet 10b with a resulting increase in porosity. Therefore, when a reduction is made in porosity without heat treatment to the ceramic sheet 10b, it is preferred that a laminated process is carried promptly. When heat is applied to the ceramic sheet 10b in the process of a porosity reduction, since polyethylene undergoes a plastic deformation, the porosity of the ceramic sheet 10b does not change much even if the ceramic sheet 10b is left standing for a long period.

(3) A reduction in porosity of a ceramic sheet 10a causes the coefficient of elasticity thereof to increase, thereby allowing a ceramic sheet 10b to be prevented from being stretched in the manufacturing process.

(4) By a pressing force applied to a ceramic sheet 10a across the thickness thereof in order to make a reduction in porosity thereof, microscopic asperities on the surface of a ceramic sheet 10b, on which a conductive layer 2 is formed, are allowed to be reduced. As a result, said layer 2 can be formed on the ceramic sheet 10b easily.

(5) When a pressing force is applied at temperatures between the glass-transition temperature of an organic material in a ceramic sheet 10a and the melting point thereof in order to make a reduction in porosity of the ceramic sheet 10a, it is preferred that the pressing force application and the heating are performed at the same time or the pressing force application precedes the heating. Particularly, when a reduction is made in porosity of a ceramic sheet 10a prepared by the use of poliethylene, it is needed that the pressing force application and the heating are performed at the same time or the pressing force application precedes the heating. The reason is that, when heating takes place to raise the temperatures higher than the glass-transition temperature of polyethylene and to keep the temperatures lower than the melting point thereof while no pressing force being applied to the ceramic sheet 10a, the ceramic sheets 10a and 10b are made to shrink in the width direction thereof due to the shrinkage of polyethylene, thereby making it difficult to obtain the ceramic sheet 10b with a uniform thickness and free of wrinkles.

(6) By reducing the porosity of a ceramic sheet 10b less than 50%, an infiltration preventive effect against a metallic constituent in said layer 2 to penetrate into a ceramic sheet 10b is remarkable. However, when a provisional laminate and a laminated block are produced, an excessively low level of porosity makes it difficult to smooth out the difference in level between an area with a conductive layer 2 and other area without conductive layer 2 resulting in bringing about structural defects. Therefore, it is desirable for the porosity to be ranging from 10% to 40%.

(7) The pressing force applied to a ceramic sheet 10b with a reduction in porosity during the preparation process thereof is desired to be not exceeding the pressing force applied to the provisional laminate at a later step and more preferably to be lower than the pressing force applied to the provisional laminate. The reason is that an excessively low level of porosity in the ceramic sheet 10b before producing the provisional laminate makes it difficult to smooth out the diference in level between an area with a conductive layer 2 and an other area without the conductive layer 2, resulting in bringing about structural defects.

(8) When a heat treatment is applied during the steps to obtain a provisional laminate by the use of ceramic sheets 10a and 10b containing an organic binder, the heat treatment at temperatures ranging from the glass-transition temperature of the organic binder and the melting point thereof, enhance the fluidity of polyethylene ,results in a remarkable heat treatment effect.

(9) A ceramic sheet 10a is formed of the organic material arranged horizontally in a mesh-like structure and at random in the thickness direction, having ceramic particles 11 absorbed in the meshes. As a result, the ceramic particles 11 are arranged in layers, each also appearing to be a mesh-like structure, thereby allowing the metallic constituents to be prevented from entering into the ceramic sheet 10a.

(10) Although polyethylene of over 400,000 in average molecular weight is used as the binder in the foregoing exemplary embodiments, it does not matter whether other polyolefin arranged horizontally in a mesh-like structure and at random in the thickness direction is used in place of polyethylene.

(11) Although a description has been given to multilayer ceramic capacitors in the foregoing exemplary embodiments, the same effects can be obtained with such ceramic electronic components as a multilayer varistor, multilayer inductor, multilayer ceramic substrate, ceramic filter and the like that are produced by stacking ceramic sheets and conductive layers one over another to form a laminate.

Industrial Applicability

According to the present invention as described in above, by having a reduction made beforehand in porosity of a ceramic sheet, the metallic constituent in a conductive layer penetrating into the ceramic sheet is allowed to be limited to the minimum, and further by having a conductive layer formed so as to make it difficult for the metallic constituent to penetrate into the ceramic sheet, the short-circuiting failures of ceramic electronic components are allowed to be reduced to an extreme, thereby enabling the improvement in production yields. Particularly, the present invention brings about the greatest effect for the improvement of production yields in multilayer ceramic chip capacitors which require the use of thin ceramic sheets and a great extent of lamination.

What is claimed is:

1. A method of manufacturing ceramic electronic components comprising:
   a first step of making a reduction of porosity in a ceramic sheet containing a ceramic powder and an organic material by applying a pressing force thereto;
   a second step of forming a conductive layer on said sheet by using a metallic paste;
   a third step of producing a laminate by stacking a plurality of said sheets, each having said conductive layer formed thereon, in such a way as having said conductive layers located opposite to each other and sandwiching said conductive layer between two adjoining ceramic sheets; and a fourth step of firing said laminate, wherein said ceramic sheet presents 50% or more in porosity before said first step and less than 50% in porosity after said first step.

2. The method of manufacturing ceramic electronic components according to claim 1, wherein said ceramic sheet contains at least a ceramic constituent and polyethylene in said first step.

3. The method of manufacturing ceramic electronic components according to claim 1, wherein said pressing force applied in said first step is smaller than a pressing force applied in producing said laminate in said third step.

4. The method of manufacturing ceramic electronic components according to claim 1, wherein heat is applied together with said pressing force.

5. The method of manufacturing ceramic electronic components according to claim 4, wherein the heat treatment is carried out at temperature ranges from a glass-transition temperature of at least one organic material contained in said ceramic sheet to a melting point thereof.

6. The method of manufacturing ceramic electronic components according to claim 1, wherein said ceramic sheet presents less than 20% in porosity after said first step.

7. The method of manufacturing ceramic electronic components according to claim 1, wherein said ceramic sheet is formed of said organic material extending horizontally in a mesh-like structure and at random in the thickness direction, with ceramic particles absorbed in the mesh-like structure so as to be arranged extending horizontally in the mesh-like structure and at random vertically.

8. The method of manufacturing ceramic electronic components according to claim 1, wherein said organic material comprises polyolefin.

9. The method of manufacturing ceramic electronic components according to claim 8, wherein said polyolefin is polyethylene.

10. A method of manufacturing ceramic electronic components comprising:

a first step of making a reduction of porosity in a ceramic sheet containing a ceramic powder and an organic material by applying a pressing force thereto;

a second step of forming in advance a conductive layer on a base film by using a metallic paste and superimposing said conductive layer on said ceramic sheet;

a third step of producing a laminate by stacking a plurality of said ceramic sheets, each having said conductive layer superimposed thereon, in such a way as having said conductive layers located opposite to each other and sandwiching said conductive layer between two adjoining ceramic sheets; and a fourth step of firing said laminate, wherein said ceramic sheet presents 50% or more in porosity before said first step and less than 50% in porosity after said first step.

11. The method of manufacturing ceramic electronic components according to claim 10, wherein said ceramic sheet contains at least a ceramic constituent and polyethylene in said first step.

12. The method of manufacturing ceramic electronic components according to claim 10, wherein said pressing force applied in said first step is smaller than a pressing force applied in producing said laminate in said third step.

13. The method of manufacturing ceramic electronic components according to claim 10, wherein heat is applied together with said pressing force.

14. The method of manufacturing ceramic electronic components according to claim 13, wherein the heat treatment is carried out at temperature ranges from a glass-transition temperature of at least one organic material contained in said ceramic sheet to a melting point thereof.

15. The method of manufacturing ceramic electronic components according to claim 10, wherein an organic constituent contained in a conductive layer before being superimposed in said third step ranges from 5 wt % to 15 wt % against 100 wt % of a metallic constituent.

16. The method of manufacturing ceramic electronic components according to claim 10, wherein a step of applying a pressing force to said conductive layer in a thickness direction thereof is provided between said second step and said third step.

17. The method of manufacturing ceramic electronic components according to claim 10, wherein said ceramic sheet presents less than 20% in porosity after said first step.

18. The method of manufacturing ceramic electronic components according to claim 10, wherein said ceramic sheet is formed of said organic material extending horizontally in a mesh-like structure and at random in the thickness direction, with ceramic particles absorbed in the mesh-like structure so as to be arranged extending horizontally in the mesh-like structure and at random vertically.

19. A method of manufacturing ceramic electronic components comprising:

a first step of producing a laminate by stacking ceramic sheets, each containing an organic material and a ceramic powder, and conductive layers one over another alternately; and a second step of firing said laminate, wherein said ceramic sheet has said organic material extending horizontally in a mesh-like structure and at random in the thickness direction, with ceramic particles absorbed in the mesh-like structure so as to be arranged extending horizontally in the mesh-like structure and at random vertically, wherein said organic material comprises polyethylene fibers.

20. The method of manufacturing ceramic electronic components according to claim 19, wherein said ceramic sheet presents less than 50% in porosity.

21. The method of manufacturing ceramic electronic components according to claim 19, wherein said first step consists of a repeating process comprising the steps of superimposing a conductive layer formed on a base film on said ceramic sheet and peeling off said base film; and superimposing said another ceramic sheet on said conductive layer.

22. The method of manufacturing ceramic electronic components according to claim 21, wherein there is provided an additional step of applying a pressing force to said conductive layer before being superimposed on said ceramic sheet.

23. The method of manufacturing ceramic electronic components according to claim 19, wherein said conductive layer is formed by using a thin film process.

* * * * *